United States Patent [19]

Strickland et al.

[11] Patent Number: 4,673,870

[45] Date of Patent: Jun. 16, 1987

[54] AUTOMATED CALIBRATION TECHNIQUE FOR NON-FIELD PERTURBING (ELECTRICALLY SMALL) ELECTROMAGNETIC FIELD SENSORS

[75] Inventors: Brian R. Strickland; George R. Edlin, both of Huntsville, Ala.

[73] Assignee: The United States of America as represented by the Secretary of the Army, Washington, D.C.

[21] Appl. No.: 763,362

[22] Filed: Aug. 7, 1985

[51] Int. Cl.⁴ ...................... G01R 35/00; G01R 21/00
[52] U.S. Cl. ........................................ 324/74; 324/95; 324/130
[58] Field of Search ..................... 324/74, 95, 130, 72; 455/67, 226; 340/600; 343/703; 364/571

[56] References Cited

U.S. PATENT DOCUMENTS 4,088,951  5/1978  Fletcher et al. ...................... 324/74
4,272,765  6/1981  White ..................................... 324/95

Primary Examiner—Ernest F. Karlsen
Attorney, Agent, or Firm—John C. Garvin, Jr.; Robert C. Sims

[57] ABSTRACT

A small field probe is calibrated by selectively varying the field intensity and frequency and recording the data in arrays with each incremental step. The arrays are built by selectively varying one parameter while maintaining another constant. In this way coefficients of the equation for the calibration of the probe is arrived.

7 Claims, 1 Drawing Figure

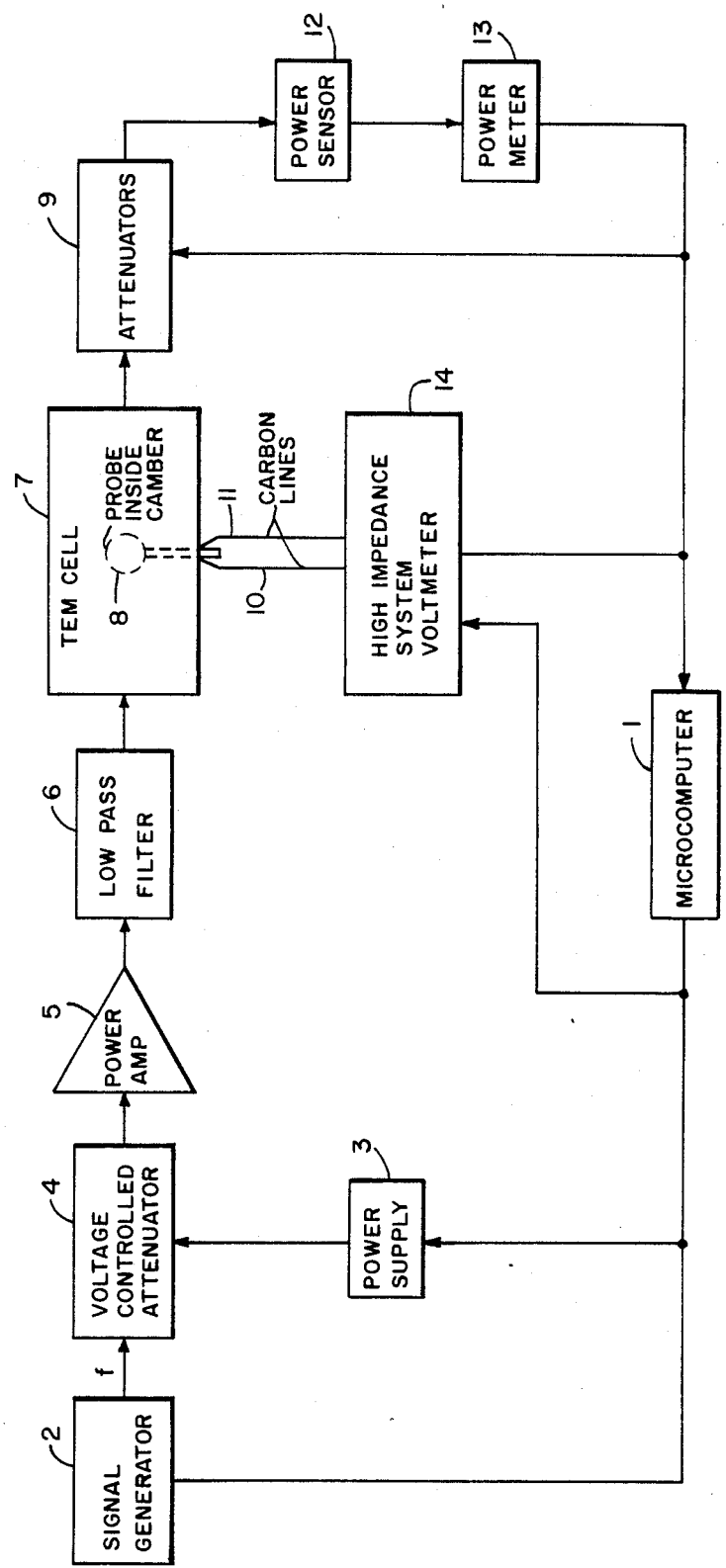

AUTOMATED CALIBRATION TECHNIQUE FOR NON-FIELD PERTURBING (ELECTRICALLY SMALL) ELECTROMAGNETIC FIELD SENSORS

DEDICATORY CLAUSE

The invention described herein may be manufactured, used, and licensed by or for the Government for governmental purposes without the payment to us of any royalties thereon.

BACKGROUND OF THE INVENTION

One of the basic requirements for electromagnetic (EM) testing of various electronic systems is the accurate characterization of the EM test fields. This is normally a very time consuming process. The invention described in this application greatly reduces the time required to map the test fields by increasing the bandwidth usability of the probes as well as simplifing the type test equipment utilized in the mapping process. There are several prior art methods of calibration of field measuring probes. Among these are the standard antenna method, the standard field method and the injection method. Basically, the standard field technique involves placing the probe in a known standard field and determining a calibration factor or antenna coefficient from the magnitude of the known field and the output of the probe. The antenna equations must be solved for "E", and $$K = E_m/E_k \qquad \text{Eqn. 1}$$

where
  K = the antenna coefficient
  $E_m$ = the measured field
  $E_k$ = the known field To calibrate an antenna using the standard antenna method, the calibrating field is measured first using a standard antenna. The antenna under test is then substituted in place of the standard antenna. From these data, the antenna coefficient can be determined. With the injection method, a low impedance voltage source (less than 0.1 ohm) is used to inject a known voltage in series with the antenna. By calculating the effective length of the antenna and knowing the injected voltage, the antenna coefficient can be determined. This method is the least accurate, while the standard field method is the most accurate.

Present electromagnetic field calibration techniques are very costly involving many man-hours of work, first calibrating the measurement antenna systems and then using this calibration to calibrate the unknown EM field. This involves the use of tuned measurement systems for a high degree of accuracy which means the adjustment of the antenna size depending on the frequency of interest. Wide band antenna systems (typically no more than 2 to 1) are easier to use but are typically not as accurate as the tuned systems. This invention provides the following advantages:

(1) Allows for the use of automated test equipment.

(2) Allows a probe to be calibrated far beyond the normal probe bandwidth since the antenna need not be tuned.

(3) Will allow fast calibration immediately prior to the field calibration so that very accurate calibrations can be obtained for any possible environmental conditions, such as temperature and humidity.

(4) Will do data regressions as the calibration is done to reduce the calibration table, therefore, reducing the necessary information storage requirements.

(5) For quick use calibration will reduce all data to 8 numbers which can be used in a polynomial to give ±1 dB accuracy.

SUMMARY OF THE INVENTION

Calibration of this system is performed with the use of a standard field. The probe is placed inside the field and the frequency and the field intensity are varied by use of a microcomputer and peripheral equipment to carry out these variations. The computer also stores the information received from the probe to be calibrated. Basically three variations are programmed to be calibrated. Two of these variations will be kept constant while varying the third through a series of changes and this stored into the computer in an array. These steps are repeated with one of the constant factors incremented to one step further until all the variations are stored in a plurality of arrays. Then the coefficient of the equations are generated to give the calibration of the probe.

BRIEF DESCRIPTION OF THE DRAWINGS

The single FIGURE is a block diagram illustrating apparatus of carrying out the present invention.

DESCRIPTION OF THE BEST MODE AND PREFERRED EMBODIMENTS

Calibration for this system is performed using a standard field. A TEM (transverse electromagnetic) Transmission Cell is used to establish the standard field. With this TEM cell the standard field method can be used with great accuracy since the only field perturbations are caused by the probe itself and no other sources of reflection and interference such as the ground are present.

TEM Cells are sections of a two conductor transmission line which operate in the transverse electromagnetic mode. The cell is structured of a rectanglar outer conductor and a flat center conductor. The center conductor, or septum, is located midway between the top and bottom walls. The ends of the cell taper down to precision type N connectors at each end. Dimensions and tapers of the cell are choosen to provide a 50-ohm impedance from end to end and a maximum usable frequency of 500 MHZ.

The field at the center of the cell is uniform and very close to the 377-ohm impedance of free space. The electric field intensity in volts per meter at the center of the cell, midway between the septum and outer wall is given by the equation $$E = 47.1 \sqrt{P_n} \qquad \text{Eqn. 2}$$

when $P_n$ is the net power transmitted thru the cell. The electric field is polarized normal to the plane of the septum. The probe to be calibrated is placed in the cell and the output voltage is measured through the ports provided in the cell.

The output voltage from any probe can be expressed by the following equation:

$$V_o = \text{function of } f, F, T \qquad \text{Eqn. 3}$$

where f = frequency
F = field intensity (B or E)
T = temperature

This is the relationship most useful when it is desired to use the calibrated probe to calibrate the electromagnetic field in front of an antenna system. For a required E-field of 10 volts/meters, equation 3 gives the output voltage of the probe necessary to achieve this 10v/m. In this way the transmitter power at each frequency can be determined to give the required field.

If it is desired to use the probe to measure unknown fields then the following equation will be more useful.

$$F = \text{function of } f, V_o, T \qquad \text{Eqn. 4}$$

Determination of the unknown field could be obtained from equation 3 by iteration techniques but can be obtained directly if the probe is calibrated to give equation 4. It is highly unlikely that equation 4 could be directly solved from equation 3 due to the complex nature of equation 3. For example, if equation 3 is a third order polynomial it has three solutions with only one being correct.

A microcomputer 1, such as an Hewlett-Packard 9825A, is utilized to control the operation of calibrating the probe and to read out the results. The IEEE-488 Interface Bus is used throughout the system. The block diagram of the computer calibration system is shown in the figure. Data is taken by the computer dependent on the desired final form of the calibration equation. (i.e. equation 3 or 4). By use of signal generator 2, power supply 3 voltage controlled attenuator 4 and low pass filter 6 the appropriate conditions are created inside the TEM Cell 7 where the probe 8 to be calibrated is placed. Attenuator 9 and carbon lines 10 and 11 are provided to read the field output and/or the voltage output of probe 8. Power sensor 12, power meter 13 and high impedance system volt meter 14 are provided for inputing to the computer 1. Because of the unpredictable nature of the temperature variations it is considered more accurate to perform the calibration at ambient temperature immediately prior to using the probe. With T now being a constant this leaves 4 possible ways to calibrate the probes. All 4 of these methods are outlined below. The one chosen depends on the desired form of the final regressed equation and the type probe used.

Method 1. Equation 3 is the final form. The data is first regressed at a fixed frequency.
1. The frequency is set.
2. A given field intensity is set within 0 to 1 dB (since the signal generator 2 has a 1 dB step attenuator).
3. The voltage contolled attenuator 4 is adjusted to give the required field intensity.
4. Vo, f, and F are stored in an array in microcomputer 1.
5. 2, 3, and 4 are repeated incrementally increasing the field intensity each pass until the maximum desired field intensity is reached.
6. The data is regressed by microcomputer 1 yielding Vo=f(F), T and f constants.
7. The above is repeated incrementing the frequency until the maximum desired frequency is reached.
8. The coefficients of the equations generated in 6 are regressed.

Method II Equation 3 is the final form. The data is first regressed at a fixed field intensity.
1. The field intensity is set.
2. A given frequency is set.
3. Vo, f, and F are stored in an array.
4. 2 and 3 are repeated incrementing the frequency each pass until the maximum frequency is reached.
5. The data is regressed yielding $V_o$=f(f), T and F are constants.
6. The above is repeated incrementally increasing the field intensity until the maximum field intensity is reached.
7. The coefficients of the equations generated in 5 are regressed.

If the field (to be calibrated with the probe) only has to be calibrated at one field intensity, then step 6 and 7 can be deleted yielding a linear set of data requiring only one regression. This should be the most accurate method.

Method III Equation 4 is the final form. The data is first regressed at a fixed frequency.
1. The frequency is set.
2. The field intensity is adjusted until a given Vo is obtained.
3. Vo, f, and F are stored in an array.
4. 2 and 3 are repeated incrementing the output voltage Vo each pass until the maximum Vo is reached.
5. The data is regressed yielding F=f(Vo) T and f constants.
6. The above is repeated varying the frequency in step until the maximum frequency range is reached.
7. The coefficients of the equations generated in 5 are regressed.

Method IV Equation 4 is the final form. The data is first regressed around a fixed output voltage.
1. The output voltage is set by adjusting the field intensity.
2. A given frequency is set.
3. Vo, f, and F are stored in an array.
4. 2 and 3 are repeated incrementing the frequency each pass until the maximum frequency is reached.
5. The data is regressed yielding F=f(f), T and Vo constants.
6. The above is repeated varying the output voltage until the maximum desired frequency range is reached.
7. The coefficients of the equations generated in 5 are regressed.

To illustrate the calibration procedure assume that equation 3 is the desired final form and 9 frequency points and 9 field levels are used (81 data points). One of the advantages of the methods outlined above is that only a small amount of program memory is needed. In the above example only 9 data points need to be stored at any one time. After the $1^{st}$ regression is performed these data points can be discarded if program memory is a problem and only the coefficients of the regressed equation stored. Assuming method 1 and $3^{rd}$ order polynomial regression we obtain $$V_o = C_{11}F^3 + C_{12}F^2 + C_{13}F, f = f_1 \qquad \text{Eqn. 5}$$
$$V_o = C_{21}F^3 + C_{22}F^2 + C_{23}F, f = f_2$$
$$\cdot$$
$$\cdot$$
$$\cdot$$
$$V_o = C_{91}F^3 + C_{92}F^2 + C_{93} = F, f = f_9$$

Polynomial regression will fit any well behaved curve well if a large enough order is chosen and/or limited frequency range is used. However, with some a priori knowledge of the probe to be calibrated a more efficient regression could be chosen such as a power series. The type regression used, of course, depends on the probe to be calibrated. A polynomial regression is used in the above example merely for demonstration purposes.

Equation 5 has reduced the original $9\times 9$ matrix (81 data points) to a $9\times 3$ matrix (27 data points) composed of the coefficients in equation 5. Note that in equation 5 that a constant term does not exist. This is because it is desired to force $F=0$ when $Vo=0$. Now a single equation is obtained from equation 5 by using regression techniques on each column of the new $9\times 3$ matrix giving the following equation:

$$Vo = C_1(f) F^3 + C_2(f) F^2 + C_2(f) F \qquad \text{Eqn. 6}$$

Assuming a $3^{rd}$ order polynomial for each of the coefficients in equation 6, it is seen that the original 81 data points have been reduced to 9 numbers.

The data reduction, of course, would be more dramatic if a typical number of frequencies and field intensities were used. For example, with 1000 frequencies and 1000 field intensity levels the data reduction of these 1 million data points to 9 numbers is significant. Also, with the method described above only 1000 numbers would have to be stored at any given time instead of 1 million numbers.

Another important point is the fact that the multiple regression technique can be used with any data set even if the number of interdependent variables is greater than 3. With 3 interdependent variables 2 separate regressions are needed. With 4 interdependent variables 3 separate regressions are needed, etc. A hand-held programable calculator such as the HP41CV can be used by programming the equations in it after being determined by the microcomputer 1. The calculator would then act as the calibrated meter for the system.

Method I and II will yield calibration equation in the form of equation 3. Method III and IV will yield a calibration equation in the form of equation 4. Therefore, the method of calibration used will depend on whether the use of the probe is to measure a field or to calibrate a field. Whether Method I is used instead of Method II will depend on the probe being calibrated (the data set being reduced). Whether Method III is used instead of Method IV will depend on the probe being calibrated. The regression technique chosen (i.e., polynomial, power series, etc.) will also depend on the probe being calibrated.

In the case of 2nd order polynomials used for all regressions we have for illustration purposes:

Method I would yield $$Vo = (C_{11}f^2 + C_{12}f + C_{13}) F^2 + (C_{21}f^2 + C_{22}f + C_{23})F + (C_{31}f^2 + C_{32}f + C_{33})$$

Method II would yield $$Vo = (C_{11}F^2 + C_{12}F + C_{13})f^2 + (C_{21}F^2 + C_{22}F + C_{23})f + (C_{31}F^2 + C_{32}F + C_{33})$$

Method III would yield $$F = (C_{11}f^2 + C_{12}f + C_{13})Vo^2 + (C_{21}f^2 + C_{22}f + C_{23})Vo (C_{31}f^2 + C_{32}f + C_{33})$$

Method IV would yield $$F = (C_{11}Vo^2 + C_{12}Vo + C_{13})f^2 + (C_{21}Vo^2 + C_{22}Vo + C_{23})f + (C_{31}Vo^2 + C_{32}Vo + C_{33})$$

We claim:
1. A method for calibrating a electromagnetic field probe comprising the steps of:
    a. placing the probe inside a controlled environment;
    b. creating a field within this environment;
    c. maintaining all variations affecting the controlled environment substantially constant except for three functional variations which are frequencies of the field, intensity of the field, and voltage present on the probe;
    d. maintaining one of the functional variations at a set first value;
    e. adjusting a second of the functional variations in incremental steps;
    f. storing the values of the functional variations for each incremental step of the second functional variation in arrays;
    g. changing the value of the first functional variation in a step fashion and repeating steps e and f for each incremental step of the first functional variation; and
    h. utilizing the information stored in the arrays to generate coefficients of an equation for the calibration of the probe.
2. A method as set forth in claim 1 further comprising the steps of:
    i. chosing to incrementally vary the voltage and frequency outputs of the probe if the function of the probe is to measure an unknown field; and
    j. chosing to incrementally vary the field and frequency supplied to the probe if the function of the probe is to create a known field.
3. A method as set forth in claim 1 further comprising the steps of:
    i. chosing to display the probe calibration data as a probe voltage output as a function of frequency and field intensity, and
    j. chosing to display the probe calibration data as a field intensity as a function of frequency and probe output voltage.
4. A method for calibrating a electromagnetic field probe which is to be used to calibrate a known electromagnetic field comprising the steps of:
    a. creating and maintaining a field in a controlled environment in which all factors effecting the environment are maintained in substantially constant except the frequency of the field, the intensity of the field and the output voltage of the probe;
    b. setting the field intensity at a first set field intensity value;
    c. setting the frequency of the field at a first frequency value while maintaining the field intensity at the previously set value;
    d. recording and storing the values for the voltage of the probe, the frequency, and the field intensity in an array;
    e. continuously repeating steps c and d while incrementing the frequency value until a desired frequency range is incremanted;
    f. regressing data in the areas yielding the voltage output of the probe as a function of the frequency with the field intensity held as a constant;
    g. continuously repeating steps c, d e, and f for incremental different values of the field intensity (step b)

until a given value of field intensity range is reached;

h. generating coefficients of an equation in which the voltage output of the probe is functionally proportional to the frequency of the field and the field intensity.

5. A method for calibrating a electromagnetic field probe which is to be used to calibrate a known electromagnetic field comprising the steps of:
   a. creating and maintaining a field in a controlled environment in which all factors effecting the environment are maintained in substantially constant except the frequency of the field, the intensity of the field and the output voltage of the probe;
   b. setting the frequency at a first set value;
   c. setting the field intensity at a first value while maintaining the frequency at the previously set value;
   d. recording and storing the values for the voltage of the probe, the frequency, and the field intensity in an array;
   e. continuously repeating steps c and d while incrementing the field intensity value until a desired field intensity range is incremanted;
   f. regressing data in the areas yielding the voltage output of the probe as a function of the field intensity with the frequency held as a constant;
   g. continuously repeating steps c, d, e, and f for incremental different values of the frequency until a given value of frequency is reached;
   h. generating coefficients of an equation in which the voltage output of the probe is functionally proportional to the frequency of the field and the field intensity.

6. A method for calibrating an electric field probe which is to be used to measure unknown electromagnetic field comprising the steps of:
   a. creating and maintaining a field in a controlled environment in which all factors effecting the environment are maintained in substantially constant except the frequency of the field, the intensity of the field and the output voltage of the probe;
   b. setting the output voltage on the probe at a first set output voltage value;
   c. setting the frequency at a first frequency value while maintaining the output voltage of the probe at previous set values;
   d. storing the output voltage, the frequency of the field, and the field intensity in an array;
   e. continuously repeating steps c and d while incrementing value of the frequency until a incremental frequency range is reached;
   f. regressing data in the areas yielding the field intensity as a function of the frequency with the out voltage being held constant;
   g. continuously repeating steps c, d, e, and f while incrementally varying the output voltage of the probe (step b) until a incremental range of output voltage is reached;
   h. generating coefficients of an equation of the probes output in which the field intensity is proportional to the frequency of the field and the output voltage of the probe.

7. A method for calibrating an electric field probe which is used to generate a known electric field comprising the steps of:
   a. creating a controlled environment for the field generated in which all the factors effect the field are maintained substantially constant except the frequency of the field, the intensity of the field and the voltage across the probe;
   b. setting the frequency on the probe at a first frequency value by adjusting the field intensity;
   c. setting the output voltage at a first value while maintaining the frequency of the probe at previous set value;
   d. storing the output voltage, the frequency of the field, and the field intensity in an array;
   e. continuously repeating steps of c and d for incremental values of the output voltage until a incremental voltage range is reached;
   f. regressing data in the areas yielding the field intensity as a function of the frequency with the output voltage being held constant;
   g. continuously repeating steps c, d, e, and f while incrementally varying the frequency of the probe until a incremental range of frequency is reached;
   h. generating coefficients of an equation of the probes output in which the field intensity is proportional to the frequency of the field and the output voltage of the probe.

* * * * *